United States Patent [19]
Ritter et al.

[11] Patent Number: 5,834,959
[45] Date of Patent: Nov. 10, 1998

[54] CIRCUIT ARRANGEMENT FOR GENERATING A BINARY OUTPUT SIGNAL

[75] Inventors: Siegfried Ritter, Armstadt; Thomas Wille, Hamburg; Rolf Tammer, Tabarz, all of Germany

[73] Assignee: U.S. Philips Corporation, New York, N.Y.

[21] Appl. No.: 709,503

[22] Filed: Sep. 6, 1996

[30] Foreign Application Priority Data

Sep. 6, 1995 [DE] Germany ............... 195 32 881.7
Sep. 21, 1995 [DE] Germany ............... 195 35 018.9

[51] Int. Cl.$^6$ ................................. H03K 5/151
[52] U.S. Cl. ................ 327/176; 327/166; 327/259
[58] Field of Search ....................... 327/172, 173, 327/174, 175, 176, 165, 166, 239, 259, 34; 326/93

[56] References Cited

U.S. PATENT DOCUMENTS

| | | |
|---|---|---|
| 3,818,358 | 6/1974 | Russell .................. 328/163 |
| 3,908,091 | 9/1975 | Waldeck ............... 179/16 EA |
| 4,355,283 | 10/1982 | Ott ........................ 328/61 |
| 4,988,901 | 1/1991 | Kamuro et al. ............ 307/518 |

FOREIGN PATENT DOCUMENTS

0639001A1 2/1995 European Pat. Off. ......... H03K 5/01

Primary Examiner—Timothy P. Callahan
Assistant Examiner—An T. Luu
Attorney, Agent, or Firm—Laurie E. Gathman

[57] ABSTRACT

In order to generate a non-disturbed binary output signal from a disturbed input signal, notably if the latter is periodic in the non-disturbed state, the invention proposes a circuit arrangement which includes two circuit branches which respond to different edge directions of the input signal. Each branch includes two series-connected flipflops and there is also provided a timing member which is common to the two circuit branches. As a result of a coupling of the two circuit branches to one another it is achieved that, after the triggering of one circuit branch, the other branch is blocked. Triggering of the other circuit branch is possible only after the delay time of the timing member has elapsed. It is thus achieved that the edges of the binary output signal have a minimum temporal spacing or that the binary output signal does not exceed a maximum frequency. Furthermore, a transition of the input signal is evaluated also if it occurs prior to the elapsing of the delay time. Evaluation of the signals in both circuit branches enables formation of two non-overlapping output signals.

9 Claims, 2 Drawing Sheets

CIRCUIT ARRANGEMENT FOR GENERATING A BINARY OUTPUT SIGNAL

BACKGROUND OF THE INVENTION

The invention relates to a circuit arrangement for generating a binary output signal, in which the temporal spacing of the signal edges does not drop below a minimum distance and hence the binary pulses of the output signal cannot exceed a maximum frequency, from a digital input signal in which the spacing of the edges is liable to vary, notably because of disturbances, or additional edges can occur due to interference signals.

A circuit arrangement of this kind is useful inter alia for recovering a non-disturbed clock signal from a disturbed input clock signal. This situation occurs, for example in integrated circuits which are coupled to a base station either in a contactless manner or via contacts, notably in chip card applications. Contactless chip cards are coupled to a base station via an electromagnetic field transmitted by the base station. This alternating field serves not only for the transfer of energy for operation of the integrated circuit in the chip card, but also for the transfer of information; the frequency of the alternating field may then constitute a clock signal for controlling the processing in the chip card. If the coupling between the chip card and the base station is loose, for example due to a rather large distance therebetween, interference may cause additional edges in the signal taken up by the chip card, so that a clock signal derived therefrom also contains additional edges and no longer corresponds to the alternating field transmitted by the base station. Disturbances of the clock signal also occur in the case of chip cards coupled via contacts, for example due to damaging of mechanical contacts or due to disturbances which are coupled into the transmission path by switching elements operating in the vicinity.

For the preparation of disturbed input signals, notably periodic input signals, use can be made of filter circuits, notably RC members. It is a drawback, however, that they induce a phase shift. Furthermore, it is a drawback that input signals shortened by disturbances are no longer recognized as useful signals and are completely suppressed.

A circuit arrangement in which these drawbacks are avoided and which generates an output signal with minimum edge spacing from a possibly disturbed input signal is known from EP 0 639 001 A1. It utilizes two series-connected timing members which are triggered by an edge of the input signal, via a logic member, the outputs of the timing members being fed back to said logic member and preventing a further edge in the input signal from having an effect during the delay time of the timing members. However, if an input edge occurs before the delay time of the timing members has elapsed, this edge is not evaluated but suppressed.

SUMMARY OF THE INVENTION

It is an object of the invention to generate an essentially periodic output signal with a reliably sustained upper clock frequency from an arbitrarily disturbed input signal, the course of the undisturbed periodic input signal being substantially maintained and hardly any phase shift being introduced between the disturbed input signal and the prepared output signal, only one timing member which determines the maximum frequency of the output signal being required for this purpose.

This object is achieved in accordance with the invention by means of a circuit arrangement which includes two circuit branches, each of which includes two storage stages and responds to a different direction of the input edges, both circuit branches being coupled to one another in such a manner that they are only alternatively active, the changing over from one circuit branch to the other being controlled by the transition of the input signal and by a timing member. As a result, for example after a positive edge a negative edge of the input signal will be evaluated even if it occurs prior to the elapsing of the delay time of the timing member and the input signal has the negative level.

The non-disturbed output signal can be derived from the first storage stage of a circuit branch. Moreover, two reliably non-overlapping output signals can be derived by separate combination of the output signals of the first storage stages of the two circuit branches.

BRIEF DESCRIPTION OF THE DRAWING

Embodiments of the invention will be described in detail hereinafter with reference to the drawing. Therein.

DESCRIPTION OF THE PREFERRED EMBODIMENTS

Figure 1:
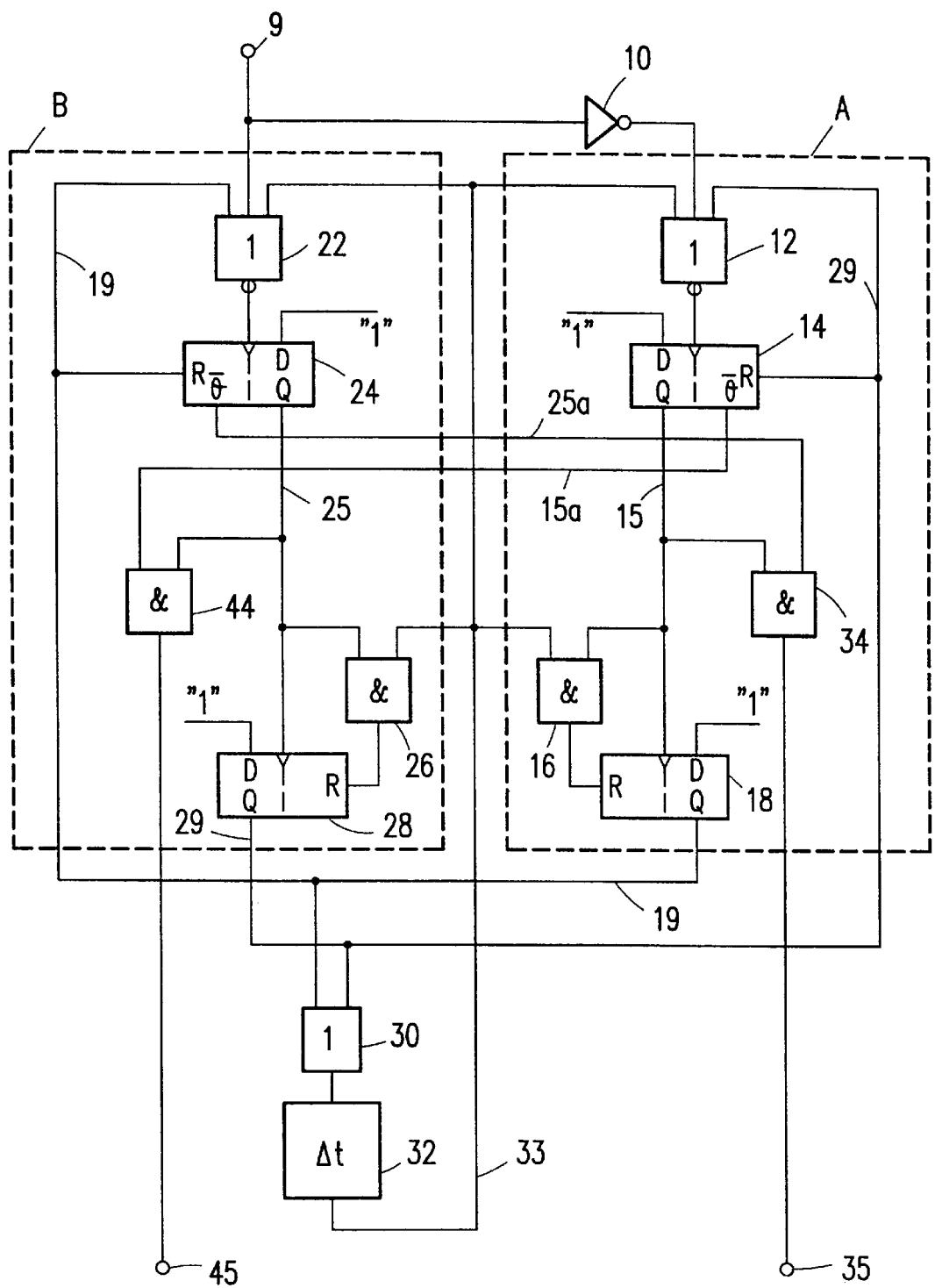
FIG. 1 shows a circuit diagram of a circuit arrangement in accordance with the invention.

The circuit arrangement shown in FIG. 1 comprises two circuit branches A and B as well as some elements which are common to both circuit branches. The two circuit branches have a similar construction.

The circuit branch A comprises a NOR-gate 12 with three inputs, one input being connected to a terminal 9 for the input signal via an inverter 10. The output of the NOR-gate 12 is connected to the clock input of an edge-controlled D-flipflop 14 whose D-input is connected to a potential corresponding to logic "1". The output Q of the flipflop 14 is connected, via the line 15, to the clock input of a further D-flipflop 18 whose D-input also constantly receives a potential corresponding to logic "1". The line 15 is also connected to an input of an AND-gate 16 whose output is connected to a reset input R of the flipflop 18. The output Q of the flipflop 18 is connected, via the line 19, to an input of an OR-gate 30, being common to both circuit branches, and to the other circuit branch B, i.e. to a reset input of an edge-controlled D-flipflop 24 and to an input of a NOR-gate 22 whose output is connected to the clock input of the flipflop 24. A further input of the NOR-gate is connected directly to the terminal 9. The output Q of the flipflop 24 is connected, via the line 25, to the clock input of an edge-controlled D-flipflop 28 and to an input of an AND-gate 26 whose output is connected to a reset input R of the flipflop 28. The output Q of the flipflop 28 is connected, via the line 29, to a further input of the OR-gate 30 and to the circuit branch A, i.e. to a reset input R of the flipflop 14 and to a further input of the NOR-gate 12. The output of the OR-gate 30 controls a timing member 32 which generates, on a line 33, a signal whose positive edge follows the corresponding output edge of the OR-gate 30 with a permanently adjusted delay and whose negative edge follows the corresponding output edge of the signal of the OR-gate 30 substantially without delay. In both circuit branches A and B the line 33 is connected to a second input of the AND-gates 16 and 26, respectively, and to a third input of the NOR-gates 12 and 22, respectively.

Figure 2:
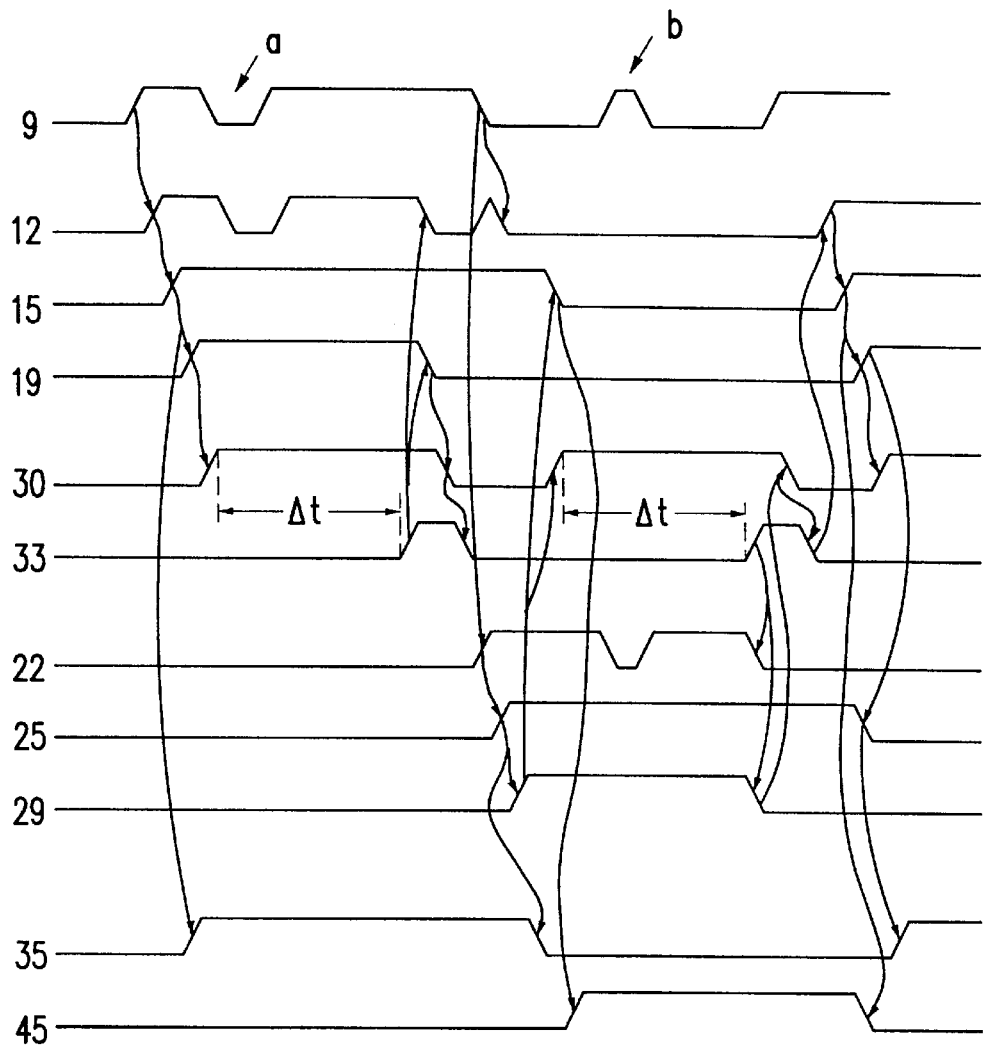
FIG. 2 shows a diagram with signal waveforms at various points within said circuit arrangement.

The function of the circuit arrangement shown in FIG. 1 will now be described in detail with reference to the diagram of FIG. 2 which shows the signal waveforms at various points on various lines in the circuit of FIG. 1. The individual signal waveforms are denoted by the reference numbers corresponding to the correspondingly denoted elements or leads in or on which these signals occur. It is assumed that the flipflops 14, 18, 24 and 28 are switched in response to a positive edge of a signal on the clock input. Moreover, positive logic is assumed, i.e. a high potential corresponds to logic "1". In the diagram of FIG. 2 arrows are shown between individual edges of various signals in order to indicate which edge of a signal is triggered by which edge of another signal.

First a positive edge occurs in the input signal on the input 9 while the flipflops 14, 18 and 28 are reset and a low signal is present on the lines 15, 19 and 29 as well as on the line 33. The state of the flipflop 24 and the signal on the line 25 are not relevant at this instant. Two of the three inputs of the NOR-gate 12, and also of the NOR-gate 22, then carry a low signal. Due to the positive edge of the signal on the input 9, the output of the inverter 10 becomes low and hence the output of the NOR-gate 12 goes high and triggers the flipflop 14. Consequently, the signal on the line 15 becomes high and triggers the flipflop 18, so that the signal on the line 19 goes high and, moreover, the AND-gate 34 supplies a high signal via the output 35, assuming that the other input of this AND-gate already carried a high potential. The high signal on the line 19, moreover, triggers the timing member 32 via the OR-gate 30 and after the delay time Δt a positive edge appears on the line 33. Should a disturbance occur in the signal on the input 9 during the delay time Δt, as indicated by the signal dip at the area a, a corresponding signal will be generated on the output of the NOR-gate 12, but the second positive edge on the output of the NOR-gate 12 cannot have an effect because the flipflop 14 has already been set so that it does not change its state in response to further edges on the clock input. Furthermore, the variation of the input signal at the area a cannot have an effect on the NOR-element 22 in the circuit branch B, because the line 19 already carried a high potential so that the output of the NOR-gate is continuously low.

It is assumed that after the delay time Δt has elapsed the signal on the input 9 is still high and the delayed ascending edge on the line 33 resets the flipflop 18, via the AND-gate 16, so that the signal on the line 19 becomes low again. As a result, the signal on the output of the OR-gate 30 also goes low, so that the signal on the line 33 also goes low. The state existing prior to the first edge of the signal shown on the input 9 has thus been restored; merely the flipflop 14 is still set, so that the signal on the line 15 is still high and hence the signal on the output 35 is also high still.

The connection of the line 33 to an input of the NOR-gate 12 ensures that the signal on the output of the NOR-gate 12 goes low in response to the leading edge of the signal on the line 33 and high in response to its trailing edge. This signal transition does not have an effect on the flipflop 14, because it is still set. For the basic operation of the circuit the connection 33 to an input of the NOR-gate 12 as well as to an input of the NOR-gate 22 is not absolutely necessary; it merely serves to prevent incorrect operation, i.e. a blocking state, in the case of signal transitions appearing in the input signal at specific instants after the positive edge of the signal on the line 33, in conjunction with unfavorable combinations of delay times of different components.

In response to the second negative edge in the signal shown on the input 9, the signal on the output of the NOR-gate 12 definitely goes low and the signal on the output of the NOR-gate 22 in the circuit branch B then goes high because the signals on the lines 19 and 33 are both low. Consequently, the flipflop 24 is switched over, the signal 25 goes high and the signal on the line 25a goes low. As a result, the signal on the output 35 goes low and the positive edge of the signal on the line 25 switches over the flipflop 28, so that the signal on the line 29 goes high and the flipflop in the circuit branch A is reset and at the same time the NOR-gate 12 is blocked. Because these two operations occur substantially simultaneously and, moreover, the flipflop 14 is permanently retained in the reset state by the signal on the line 29, incorrect operation cannot occur, not even in unfavorable circumstances where, for example a signal transition of the signal on the input 9 occurs simultaneously with the rising of the signal on the line 29.

Via the OR-element 30, the rising edge of the signal on the line 29 triggers the timing member 32 and, after the delay time Δt has elapsed, a high signal appears again on the line 33. Meanwhile, as has been described for the circuit branch A, disturbances in the signal on the input 9, for example as shown at the area b, cannot have an effect. The positive edge of the signal on the line 33 blocks the NOR-gate 22 and, via the AND-member 26, it resets the flipflop 28 so that the signal on the line 29 goes low again. However, the NOR-gate 12 in the circuit branch A is not yet enabled but is still blocked via the high signal on the line 33, so that the positive edge in the signal on the input 9 which in this case appears for example too early and substantially upon elapsing of the delay time of the timing member, cannot have an effect. Due to the low signal on the line 29, however, the input signal of the timing member 32 goes low, via the OR-member 30, and hence the signal on the line 33 also goes low and the NOR-gate 12 is enabled. The high signal on the input 9 then has an effect via the NOR-gate 12 and produces an ascending edge which switches over the flipflop 14. Thus, the premature edge in the signal on the input 9 has not been lost, but is taken into account at an instant which is dependent on the delay time of the timing member, so that the minimum edge spacing of the output signal, or the output signals, is maintained. This is because the next edge in the signal on the output 35 can occur only after the flipflop 18 has been switched over by the output signal of the flipflop 14 and the flipflop 24 has been reset by the signal on the lead 19 which is then high.

The positive edge in the signal on the output 45 of the AND gate 44 could occur only after the flipflop 14 has been reset, so that it is inevitably situated after the negative edge of the signal on the output 35. Analogously, the negative edge in the signal on the output 45 is generated if the flipflop 14 is set, and this inevitably occurs prior to the resetting of the flipflop 24 and hence prior to the positive edge on the output 35. Thus, two definitely non-overlapping signals are available on the outputs 35 and 45.

Figure 3:
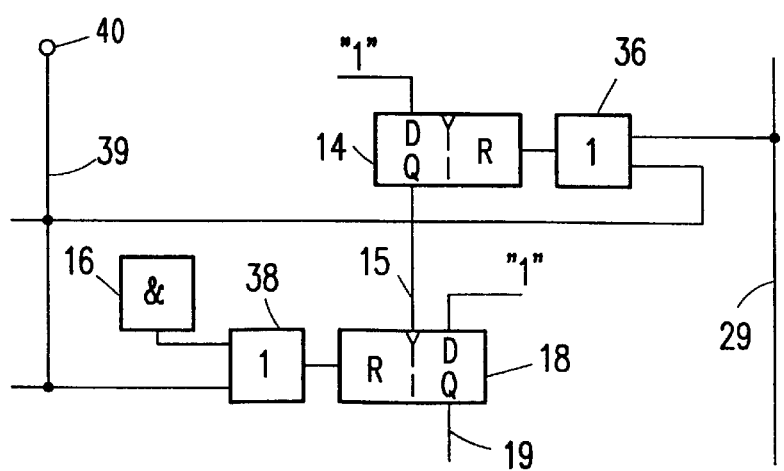
FIG. 3 shows a detail of FIG. I with a further facility for resetting.

In FIG. 3, being an extension of the circuit of FIG. 1, a reset signal establishes a defined initial state of all flipflops. For the sake of simplicity, FIG. 3 shows only the two flipflops 14 and 18 in the circuit branch A, but it will be evident that the circuit branch B is extended in the same way. The extension consists in that the reset input R of the flipflop 14 as well as of the flipflop 18 is preceded by an OR-gate 36, 38, respectively. An input of the OR-gate 36 is connected to the line 29 and a second input is connected, via a line 39, to a reset input 38. Analogously, an input of the OR-gate 40 is connected to the output of the AND-gate 16 and a second input of the OR-gate 38 is also connected to the line 39. Thus, a high signal on the reset input 40 resets each of the flipflops 14 and 18 as well as 24 and 28 in the circuit branch B whereas the other function is maintained, as described, for as long as the signal on the reset input 40 is low.

We claim:

1. A circuit arrangement for generating a binary output signal with a minimum temporal spacing of successive edges from a binary input signal with varying edge spacing, including an input terminal for the input signal and a first and a second circuit branch of identical construction, each of which includes a first storage stage with a clock input which in one circuit branch is coupled directly to the input terminal via a blocking member, while in the other circuit branch it is coupled thereto via an inverter, a second storage stage with a clock input which is coupled to an output of the first storage stage, and an output which is coupled to a reset input of the first storage stage and a blocking input of the blocking member in the respective other circuit branch, and to an input of a timing member which is common to the two circuit branches, a first logic member having two inputs, one of which is coupled to the output of the first storage stage of the same circuit branch, its other input being coupled to an output of the timing member, an output thereof being coupled to a reset input of the second storage stage of the same circuit branch, the timing member delaying one edge of a signal on the input by a predetermined delay time and outputting the other edge substantially without delay on the output, the output of the first storage stage deriving the output signal.

2. A circuit arrangement as claimed in claim 1, characterized in that the blocking member includes a further blocking input which is coupled to the output of the timing member in both circuit branches.

3. A circuit arrangement as claimed in claim 1, characterized in that at least one circuit branch includes a second logic member with two inputs and one output, one input being coupled to the output of the first storage stage of the same circuit branch, the other input being coupled to an inverting output of the first storage stage of the other circuit branch, and the output supplying the binary output signal.

4. A circuit arrangement as claimed in claim 3, characterized in that the second logic member is provided in both circuit branches and both logic members alternately output non-overlapping output signals via the outputs.

5. A circuit arrangement as claimed in claim 1, characterized in that the reset input of each storage stage in both circuit branches is preceded by a third and a fourth logic member, having two inputs, an input of the third logic member being coupled to the output of the relevant second storage stage in the other circuit branch and an input of the fourth logic member being coupled to the output of the first logic member, the other input of the third and the fourth logic member being connected to a common reset terminal.

6. A circuit arrangement as claimed in claim 2, characterized in that at least one circuit branch includes a second logic member with two inputs and one output, one input being coupled to the output of the first storage stage of the same circuit branch, the other input being coupled to an inverting output of the first storage stage of the other circuit branch, and the output supplying the binary output signal.

7. A circuit arrangement as claimed in claim 2, characterized in that the reset input of each storage stage in both circuit branches is preceded by a third and a fourth logic member, having two inputs, an input of the third logic member being coupled to the output of the relevant second storage stage in the other circuit branch and an input of the fourth logic member being coupled to the output of the first logic member, the other input of the third and the fourth logic member being connected to a common reset terminal.

8. A circuit arrangement as claimed in claim 3, characterized in that the reset input of each storage stage in both circuit branches is preceded by a third and a fourth logic member, having two inputs, an input of the third logic member being coupled to the output of the relevant second storage stage in the other circuit branch and an input of the fourth logic member being coupled to the output of the first logic member, the other input of the third and the fourth logic member being connected to a common reset terminal.

9. A circuit arrangement as claimed in claim 4, characterized in that the reset input of each storage stage in both circuit branches is preceded by a third and a fourth logic member, having two inputs, an input of the third logic member being coupled to the output of the relevant second storage stage in the other circuit branch and an input of the fourth logic member being coupled to the output of the first logic member, the other input of the third and the fourth logic member being connected to a common reset terminal.

* * * * *